United States Patent [19]

Prucnal et al.

[11] Patent Number: 4,791,407
[45] Date of Patent: Dec. 13, 1988

[54] ALTERNATE MARK/SPACE INVERSION LINE CODE

[75] Inventors: Paul R. Prucnal, New York, N.Y.; Philippe A. Perrier, Viroflay, France

[73] Assignee: Trustees of Columbia University in the City of New York, New York, N.Y.

[21] Appl. No.: 81,235

[22] Filed: Aug. 4, 1987

[51] Int. Cl.⁴ .............................................. H03M 5/04
[52] U.S. Cl. ....................................... 341/68; 455/608
[58] Field of Search .................. 455/608; 340/347 DD

[56] References Cited

U.S. PATENT DOCUMENTS

| | | |
|---|---|---|
| 3,409,875 | 11/1968 | De Jager et al. . |
| 3,808,366 | 4/1974 | Wanamaker et al. . |
| 3,967,062 | 6/1976 | Dobias .......................... 340/347 DD |
| 4,052,611 | 10/1977 | Fish ....................................... 455/608 |
| 4,475,212 | 10/1984 | McLean et al. . |
| 4,679,252 | 7/1987 | Holland ................................ 455/608 |

*Primary Examiner*—Charles D. Miller
*Attorney, Agent, or Firm*—Brumbaugh, Graves, Donohue & Raymond

[57] ABSTRACT

A communication system and method for transmitting information in the form of binary digital data to be transmitted is encoded into two separate two level sequences S1 and S2 such that the first occurrence of a logic "1" is encoded into the same level in both sequences and each subsequent occurrence of a logic "1" is encoded into the level opposite of the previous level representing a logic "1" in each of the sequences S1 and S2, and the first occurrence of a logic "0" is encoded into opposite levels in sequences S1 and S2 and every subsequent occurrence of a logic "0" is encoded into the level opposite of the previous level representing a logic "0" in each of the sequences S1 and S2. The two encoded streams drive optical signal producing means of respectively different wavelengths and the two optical signals are transmitted over a wavelength-multiplexed fiber-optic link. The receiving end of the link electrooptically converts the transmitted optical signals into electrical streams which are decoded using simple logic gates which extract both the original data and the synchronization clock digitally and without regard to the transmission rate.

8 Claims, 2 Drawing Sheets

ALTERNATE MARK/SPACE INVERSION LINE CODE

BACKGROUND AND SUMMARY OF THE INVENTION

The present invention relates to a novel line encoding scheme and communication system for transmission of digital data over a transmission link.

Various line encoding techniques have been proposed in the art of digital communications to minimize the effect of transmission impairments on the transmitted signal. These impairments are typically in the form of interference occurring between symbols, known as intersymbol interference, or in the transmission-induced jitter of a clock signal. Conventional encoding schemes and communication systems convert digitally encoded data, for instance NRZ-type data, into a sequence which requires transmission of a dedicated clock signal. The clock signal is transmitted simultaneously with the data, usually on two separate lines, or it may be embedded in the data signal.

In order to receive or decode such transmissions, complex, expensive electronic schemes and equipment are necessary. For example, where the clock signal is embedded in the data signal, the transmitted data stream undergoes a full-wave rectification or other non-linear operation and is recovered through bandpass filters having a frequency centered around the bit rate. Alternatively, many conventional schemes pass the data stream through phase-locked loops having a fixed level crossing reference, or other similar analog frequency detecting circuits.

These conventional schemes suffer the disadvantages that not only are they complex and costly to implement, but depend directly on the data transmission rate, which must be known either prior to transmission or prior to system design. These restrictions render conventional fixed-rate synchronization line encoding techniques useless in systems where the user's data rate is unknown in advance, or if services with different data rates need to share the same channel.

Moreover, the spectral characteristics of these techniques are not ideally suited for transmission over fiber-optic or other communication links and suffer from transmission-induced signal degradation while requiring precise frequency and clock recovery circuits.

There exists, therefore, a need for a line coding scheme and communication system which is absolutely transparent to the rate of the data being transmitted, both as to transmission and receiving of the data and which provides more favorable spectral characteristics for transmission of digital data over a fiber-optic link.

SUMMARY OF THE INVENTION

The present invention overcomes the deficiencies of the aforementioned schemes by providing a reliable and economical new transmission code having the properties of zero DC baseband signal content, self-clocking capability, conservation of baseband bandwith and digital extraction of both data and data rate clock signals independent of, and transparent to, the data-rate of the system. The coding system is particularly suited for use with a fiber optic transmission link.

Digital data to be transmitted is encoded into two separate binary sequences, S1 and S2, consisting of logic "1"'s and logic "0"'s providing a two-level series of marks and spaces. The encoding is effected in accordance with the following rules: (1) the first occurrence of a logic "1" is encoded into the same one of the two available levels in both sequences and each subsequent occurrence of a logic "1" is encoded into the level opposite of the previous level representing a logic "1" in each of the sequences S1 and S2, and (2) the first occurrence of a logic "0" is encoded into opposite levels in sequences S1 and S2 and every subsequent occurrence of a logic "0" is encoded into the level opposite of the previous level representing a logic "0" in each of the sequences S1 and S2. The encoding scheme requires only two signals levels and may be conveniently referred to as an Alternate Mark Space Inversion coding scheme, or AMSI.

In a preferred embodiment, the two encoded streams drive optical wavelength producing means of differing wavelengths such that the streams are transmitted over a wavelength-multiplexed fiber-optic link. The receiving end of the link electro-optically converts the transmitted streams into electrical streams which are decoded using simple logic gates which extract both the original data and the synchronization clock digitally and without regard to the transmission rate. The system thus differs significantly from simply transmitting, for instance, uncoded NRZ data and clock on separate channels.

For a better understanding of the invention, as well as other objects and further features thereof, reference is had to the following detailed description of the preferred embodiments taken in conjunction with the accompanying drawings.

DESCRIPTION OF THE PREFERRED EMBODIMENTS

Figure 1:
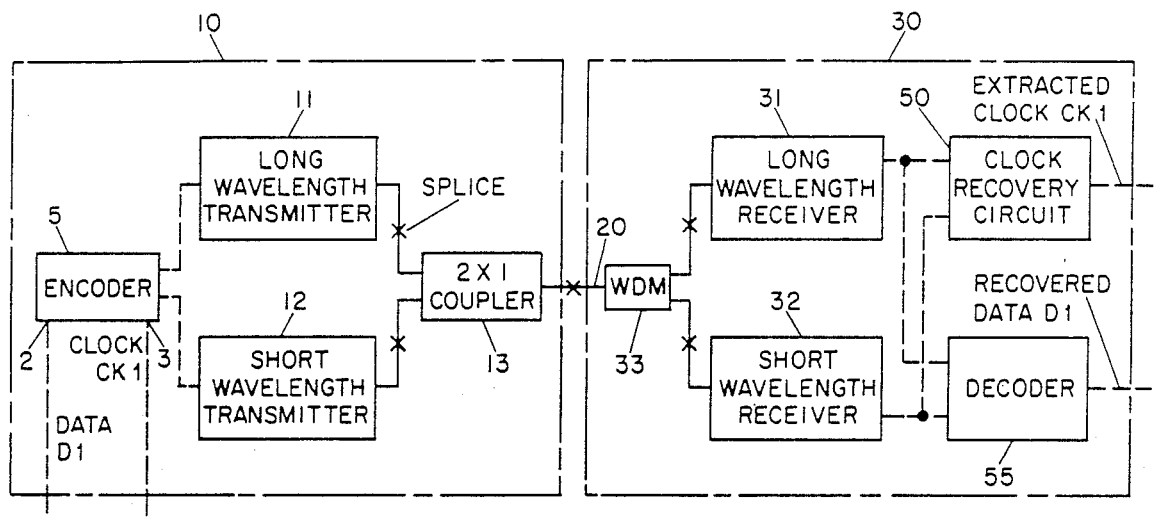
FIG. 1 is a block diagram of a wavelength-multiplexed fiber-optic communication system in accordance with the present invention.

FIG. 1 shows a block diagram of a wavelength multiplexed fiber-optic communication system employing the two-level alternate mark space inversion (AMSI) encoding scheme of the present invention. The transmission section of the communication system is indicated generally at 10 while the receiver section bears the reference numeral 30. Data to be transmitted over transmission link 20 is received by transmission section 10 at an input terminal 2 of an encoder 5 as a bit stream D1. Transmission link 20 preferably is of the fiber-optic type; however, the encoding scheme of the invention may be used with radio or wire communication links, if desired.

Encoder 5 has an additional input 3 to receive a system clock signal CK1 representative of the data rate of the data to be transmitted. The clock or data rate CK1 of the data stream D1 is irrelevant to the operation of the present invention; the communication system disclosed herein being rate transparent, but times the encoding process.

Output data streams S1 and S2 (FIG. 2) are generated by encoder 5 according to the alternate mark space inversion encoding scheme as will be described below. The two data streams S1 and S2 are fed to wavelength transmitters 11 and 12 which convert the electrical data streams S1 and S2 into optical signals of different wavelengths. The electrooptically converted data streams S1 and S2 are then supplied as inputs to a passive 2×1 directional fiber-optic coupler 13 and wavelength-multiplexed for simultaneous transmission via fiber-optic link 20, to the receiver section 30. The link 20 may be a single optical fiber carrying the two different wavelength signals or the signals may be transmitted over separate fibers. At the receiver section, wavelength division multiplexer 33, WDM, receives the transmitted optical signals from fiber-optic link 20 and separates them into the two different wavelength optical signals. Wavelength receivers 31 and 32 transform the received optical signal steams S1 and S2 back to electrical signals which are forwarded to both a decoder 55 and a clock recovery circuit 50.

The decoder 55 recovers the original data stream D1 by decoding the two streams S1 and S2 according to the alternate mark space inversion protocol. The clock recovery circuit 50 is capable of recovering the original system data rate clock signal CK1 without having a separate, dedicated clock signal transmitted along with streams S1 and S2, and without the need for any frequency transmission or detection circuits, analog or otherwise. Though the AMSI decoder does not require a clock to perform its function, a timing reference which can be extracted digitally is still useful for receiver synchronization.

Figure 2:
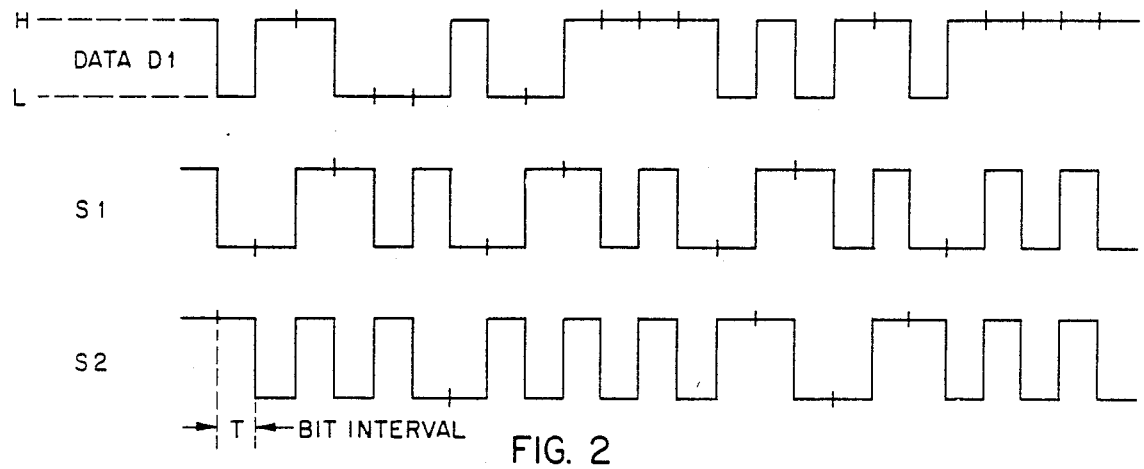
FIG. 2 is a timing diagram of a data stream and the two encoded sequences generated in accordance with the line coding technique of the present invention.

With reference to FIG. 2, the AMSI encoding scheme will now be described in detail. Data stream D1 is shown as a series of logic "1's" and "0's" represented, respectively, by a high logic level H and a low logic level L. The bit interval T for data stream D1 is hash-marked onto the stream D1 for purposes of bit cell identification. The two data streams S1 and S2 are similarly marked.

Data streams S1 and S2 are encoded based on the respective bit values of the bit stream D1 according to the following rules:

(1) The first occurrence of a logic "1" in data stream D1 is encoded into the same level in both sequences S1 and S2. The level at which the logic "1" of data stream D1 is encoded in streams S1 and S2 need not be a logic high or the same level assigned to a logic "1" in the original data stream D1. All that is mandated is that the encoded levels in the S1 and S2 sequences be the same.

Every subsequent occurrence of a logic "1" in the data stream D1 is encoded into the level opposite of the previous level representing a logic "1" in each of the data streams S1 and S2.

(2) The first occurrence of a logic "0" in data stream D1 is encoded into opposite levels in sequences S1 and S2. Again, level or order are not critical, as long as the logic zero is represented by opposite levels in the two streams. Each subsequent occurrence of a logic "0" in data stream D1 is encoded into the level opposite of the previous level representing a logic "0" in each of the data streams S1 and S2.

Figure 3:
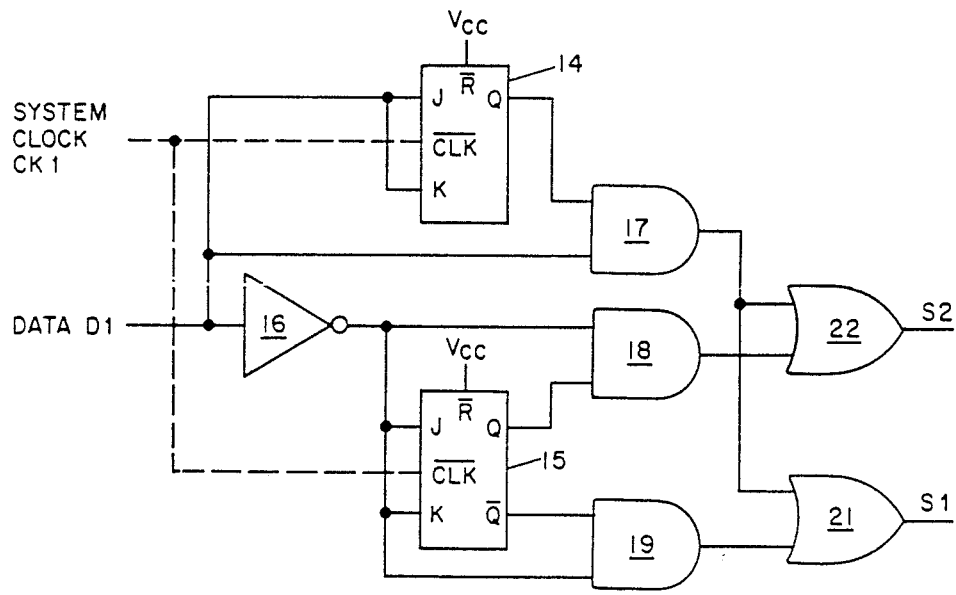
FIG. 3 is a circuit diagram of the encoder used in the system of FIG. 1.

To implement the encoding scheme, the transmission encoder 5 may have a circuit configuration such as that shown in FIG. 3. The system clock CK1 is connected to the $\overline{CLK}$ inputs of J-K flip-flops 14 and 15 while data stream D1 is fed directly to both the J and K inputs of flip-flop 14, and to the connected J and K inputs of flip-flop 15 via inverter 16.

The data stream D1 and the inverted version thereof from the output of inverter 16 are additionally supplied as inputs to a plurality of AND gates 17-19. The Q output of flip-flip 14 and the data stream D1 are supplied as inputs to gate 17 and the Q and $\overline{Q}$ outputs of Flip-flop 15 are supplied as inputs to gates 18 and 19, respectively, along with outputs from inverter 16, as shown in FIG. 3. A final logic or function is provided by OR gates 21 and 22; gate 21 providing as its output the S1 sequence and gate 22 providing as its output the S2 sequence.

The electro-optic conversion of the S1 and S2 sequences by wavelength transmitters 11 and 12 may be accomplished simply by having the S1 and S2 streams drive LED's or laser diodes and producing optical outputs of differing wavelengths.

The S1 and S2 signal sequences, without a clock signal, are then transmitted over link 20 via 2×1 coupler 13.

At the receiving end of the fiber-optic link 20, multimode wavelength division multiplexer 33 and long and short wavelength receivers 31 and 32, respectively, operate in a manner opposite to their transmission counterparts coupler 13 and long and short wavelength transmitters 11 and 12 such that the electro-optically converted streams S1 and S2 are reconstituted into electrical signals for decoding by decoder 55. Receivers 31 and 32 may be photo-sensitive diodes, or other similar light receiving means.

Figure 4:
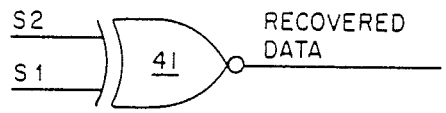
FIG. 4 is a circuit diagram of the data decoder used in the system of FIG. 1.

The decoder 55 recovers the original data stream D1 from the received sequences S1 and S2 by subjecting them to an exclusive NOR operation, conveniently implemented as shown in FIG. 4 by exclusive NOR gate 41. The recovered data stream D1 may then be checked for errors by a bit-error-rate tester, not shown for simplicity.

Figure 5:
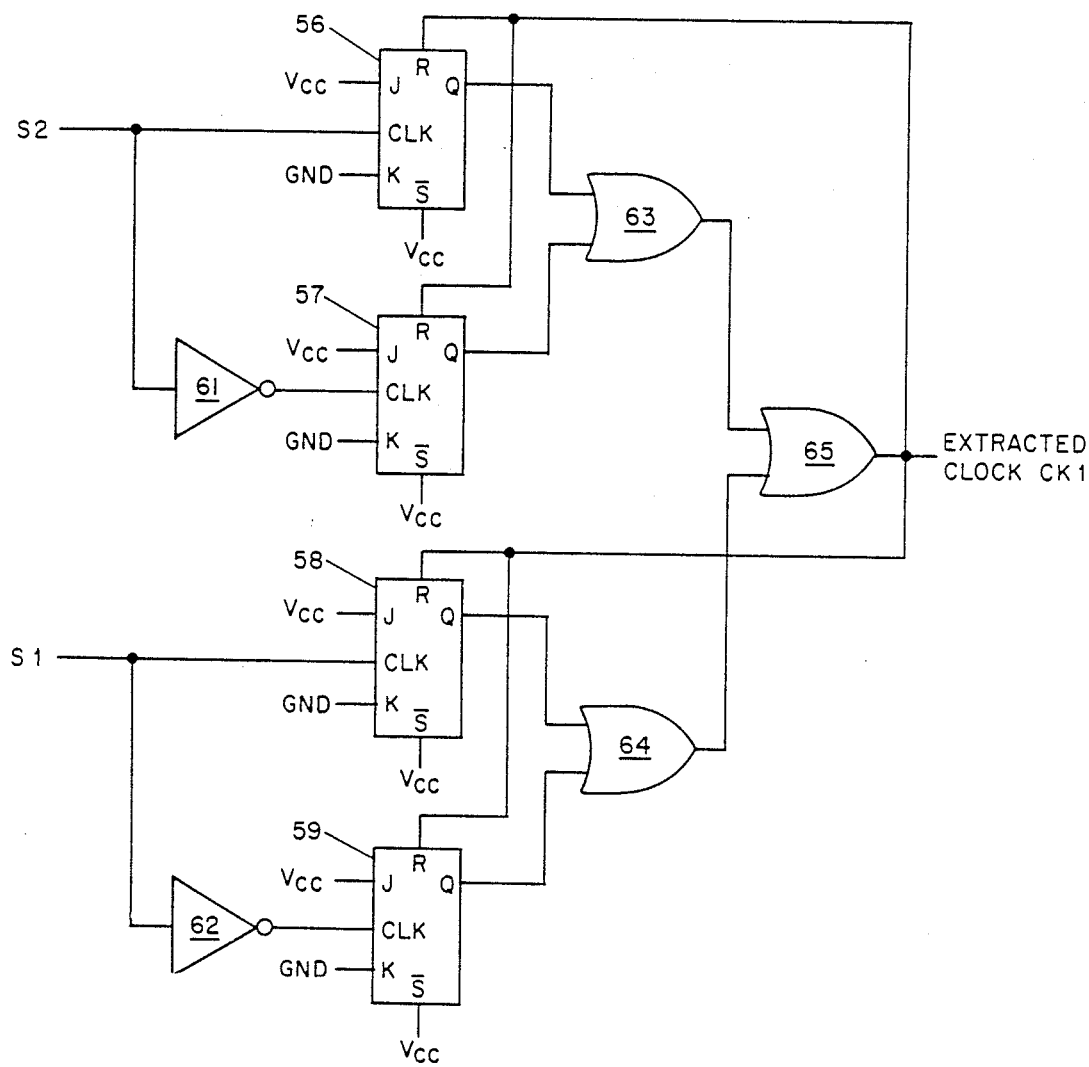
FIG. 5 is a circuit diagram of the clock recovery circuit used in the system of FIG. 1.

To extract the system clock CK1 from the received signal sequences, the circuit of FIG. 5 is provided.

As shown in FIG. 5, the S1 and S2 sequences from the outputs of receivers 31 and 32 are supplied directly to drive the CLK inputs of a first pair of J-K flip-flops 58 and 56, respectively, while the CLK inputs of a second pair of J-K flip-flops, 59 and 57, are driven by sequences S1 and S2 via inverter 62 and 61, respectively. The J inputs of flip-flops 56 to 59 are kept at a logic high level (e.g. Vcc) while the respective K inputs are tied to a logic low level (e.g. ground). The Q outputs of flip-flops 56 and 57 are fed to OR gate 63 and the Q outputs of flip-flops 58 and 59 are fed to OR gate 64. Finally, the outputs of OR gates 63 and 64 are supplied as inputs to OR gate 65, the output of which is the system clock CK1. This output is also fed back to the reset inputs of flip-flops 56-59.

It will be understood that a propagation delay between the two encoded sequences S1 and S2 will occur because they are transmitted at different wavelengths. This delay can be readily compensated by introducing electronic or fiber delay on the faster channel, i.e., the longer wavelength. The propagation delay can be minimized by selecting the two wavelengths to be close to one another, yet within the discrimination capability of the wavelength demultiplexer. For example, if the S1 and S2 streams were optically transmitted at wavelengths of 1300 and 1365 nm, respectively, the propagation delay difference is reduced to 6.5 ns/km. Typical WDM's can separate wavelength 5% apart in magnitude.

The encoding scheme of the present invention eliminates the DC baseband signal component and reduces the low-frequency spectral content by limiting the longest run of any particular level representing a "1" or "0". This limiting of the longest run of marks and spaces restricts intersymbol interference and suppresses any baseline wander. The baseband bandwith required is lower than in conventional codes, thereby reducing noise energy and maintaining, without reduction, an acceptable SNR.

With reference to FIG. 2, it can be seen that the longest run of marks or spaces in either sequence is two bit intervals, independent of the data pattern. This limit on the maximum in interval between transitions provides a balanced number of symbols in each channel, thereby producing zero DC-content and controlling the low-frequency spectral content. Furthermore, since the minimum pulse width in encoded sequences S1 and S2 is the same as in the original data, baseband bandwith is conserved.

The detailed description of the preferred embodiment of the invention having been set forth herein for the purpose of explaining the principles thereof, it is known that there may be modifications, variation or change in the invention without departing from the proper scope of the invention and the claims thereto.

We claim:

1. In a communication system for information in the form of a stream of binary digital data D1 occurring at a predetermined data rate, transmitting means comprising:
    means for encoding said digital data stream into first and second binary signal sequences S1 and S2 having predetermined first and second logic levels, said encoding means responding to said digital data stream such that (1) a first occurrence of logic "1" in said digital data stream D1 is encoded into the same logic level in both said first and second binary signal sequences and a first occurrence of a logic "0" in said digital data stream D1 is encoded into opposite logic levels in said first and second binary signal sequences, and (2) each subsequent occurrence of a logic "1" or logic "0" in digital data stream D1 in encoded into a level opposite the immediately prior level representing a logic "1" or logic "0" in each of the binary signal sequences S1 and S2.

2. A method of communicating information originating in the form of a stream of binary digital data D1 occurring at a predetermined data rate, comprising the steps of:
    encoding said digital data stream into first and second binary signal sequences S1 and S2 having predetermined first and second logic level, such that (1) a first occurrence of a logic "1" in said digital data stream D1 is encoded into the same logic level in both said first and second binary signal sequences and a first occurrence of a logic "0" in said digital data stream D1 is encoded into opposite logic levels in said first and second binary signal sequences, and (2) each subsequent occurrence of a logic "1" or logic "0" in digital data stream D1 in encoded into a level opposite the immediately prior level representing a logic "1" or logic "0" in each of the binary signal sequences S1 and S2,
    transmitting said binary signal sequences S1 and S2 over a distance, and
    receiving said transmitted binary signal sequences S1 and S2 and decoding said binary signal sequences to generate a stream of binary digital data corresponding to said digital data stream D1.

3. The method of claim 2 further comprising the steps of deriving a clock signal representative of said predetermined data rate from said received binary signal sequences.

4. A communication system for information in the form of stream of binary digital data D1 occurring at a predetermined data rate, comprising:
    means for encoding said digital data stream into first and second binary signal sequences S1 and S2 having predetermined first and second logic levels, said encoding 'means responding to said digital data stream such that (1) a first occurrence of logic "1" in said digital data stream D1 is encoded into the same logic level in both said first and second binary signal sequences and a first occurrence of a logic "0" in said digital data stream D1 is encoded into opposite logic levels in said first and second binary signal sequences, and (2) each subsequent occurrence of a logic "1" or logic "0" in digital data stream D1 in encoded into a level opposite the immediately prior level representing a logic "1" or logic "0" in each of the binary signal sequences S1 and S2,
    means for transmitting said binary signal sequences over a distance, and
    means for receiving said transmitted binary signal sequences S1 and S2 and for decoding said binary signal sequences to generate a stream of binary digital data corresponding to said digital data stream D1.

5. The communication system of claim 1 further comprising means in said receiving and decoding means for generating a clock signal representative of said predetermined data rate from said received binary signal sequences.

6. The communication system of claim 4 wherein said transmitting means includes means for converting said first and second binary signal sequences S1 and S2 into signals of respectively different wavelengths, and a transmission path for conveying said different wavelength signals to a remote point.

7. The communication system of claim 6 wherein said receiving and decoding means includes means responsive to said different wavelength signals to reconstitute said binary signal sequences S1 and S2.

8. The communication system of claim 7 wherein said converting means and said reconstituting means comprise electro-optical transducers and said transmission path comprises a multi-channel fiber-optic link.

* * * * *

UNITED STATES PATENT AND TRADEMARK OFFICE
CERTIFICATE OF CORRECTION

PATENT NO. : 4,791,407
DATED : December 13, 1988
INVENTOR(S) : Paul R. Prucnal et al It is certified that error appears in the above-identified patent and that said Letters Patent is hereby corrected as shown below:

Column 3, line 21, "steams" should read -- streams --;

Column 5, line 47, "in" should read -- is --;

Column 6, line 3, "in" should read -- is --;

Column 6, line 18, before "stream" insert -- a --;

Column 6, line 24, before "logic" insert -- a --;

Column 6, line 32, "in" should read -- is --;

Column 6, line 43, "claim 1" should read -- claim 4 --.

Signed and Sealed this

Sixteenth Day of May, 1989

Attest:

DONALD J. QUIGG

Attesting Officer

Commissioner of Patents and Trademarks